United States Patent [19]

Yamada et al.

[11] 4,293,781

[45] Oct. 6, 1981

[54] MONOSTABLE MULTIVIBRATOR

[76] Inventors: Tsuneo Yamada; Yukihiko Miyamoto, both of c/o Trio Kabushiki Kaisha, 6-17, 3-Chome, Aobadai, Meguro-ku, Tokyo 153, Japan

[21] Appl. No.: 967,636

[22] Filed: Dec. 8, 1978

[30] Foreign Application Priority Data

Mar. 15, 1978 [JP] Japan .................................. 53-29654
Mar. 15, 1978 [JP] Japan .................................. 53-29655
Mar. 15, 1978 [JP] Japan .................................. 53-29656

[51] Int. Cl.³ ...................... H03K 3/284; H03K 5/08; H03K 17/16
[52] U.S. Cl. .................................. 307/273; 307/267; 307/280; 307/296 R; 307/546
[58] Field of Search ............... 307/273, 280, 265, 266, 307/267, 237, 296 R

[56] References Cited

U.S. PATENT DOCUMENTS

| | | | |
|---|---|---|---|
| 3,619,664 | 11/1971 | Ashley | 307/273 |
| 3,820,029 | 6/1974 | McKinley | 307/273 X |
| 3,868,517 | 2/1975 | Schoeff | 307/280 |
| 3,978,347 | 8/1976 | Hollstein et al. | 307/280 X |
| 4,001,608 | 1/1977 | Zuk | 307/273 X |

*Primary Examiner*—John S. Heyman

[57] ABSTRACT

A monostable multivibrator including a gate circuit, a driver circuit responsive to the gate circuit, a differentiating circuit responsive to the driver circuit and a voltage comparison circuit responsive to the differentiating circuit where the gate circuit has a trigger pulse applied to a first input thereof and the output of the voltage comparison circuit is fed back to a second input thereof, and where the gate circuit, the driver circuit and the voltage comparison circuit are each non-saturating and include a constant current source and where clipping circuitry clips the output of the driver circuit to lessen the effect of noise produced by the constant current sources on the output of the multivibrator. Further clipping circuitry may be employed to prevent saturation of the gate circuit. A common voltage source may provide bias voltages for at least the above clipping circuits and a threshold voltage for the voltage comparison circuit. In addition to a bias power supply for the gate circuit, the driver circuit, and the voltage comparison circuit, a further supply may supply a reference voltage for clipping the output of the gate circuit and for determining the asymptotic characteristic of the output from the differentiating circuit.

20 Claims, 24 Drawing Figures

FIG. I
(PRIOR ART)
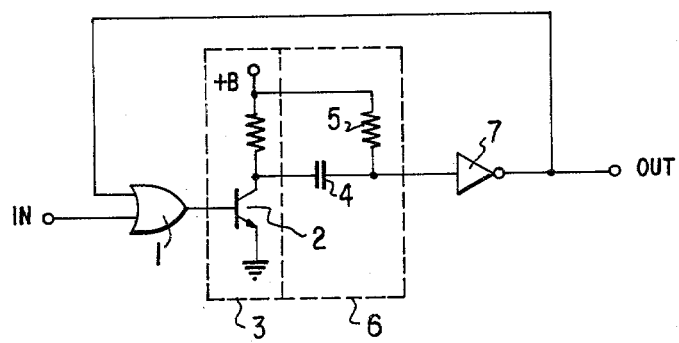
FIG. 2
(PRIOR ART)
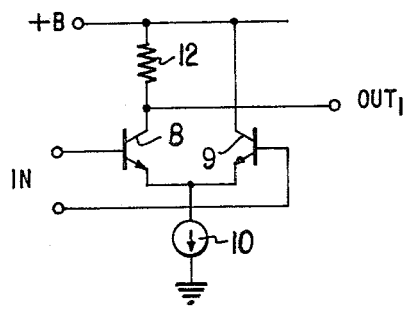
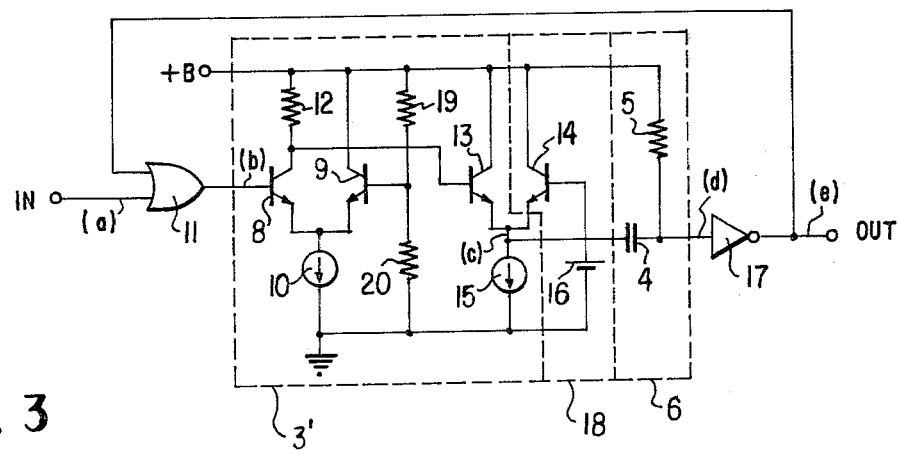
FIG. 3

FIG. 5
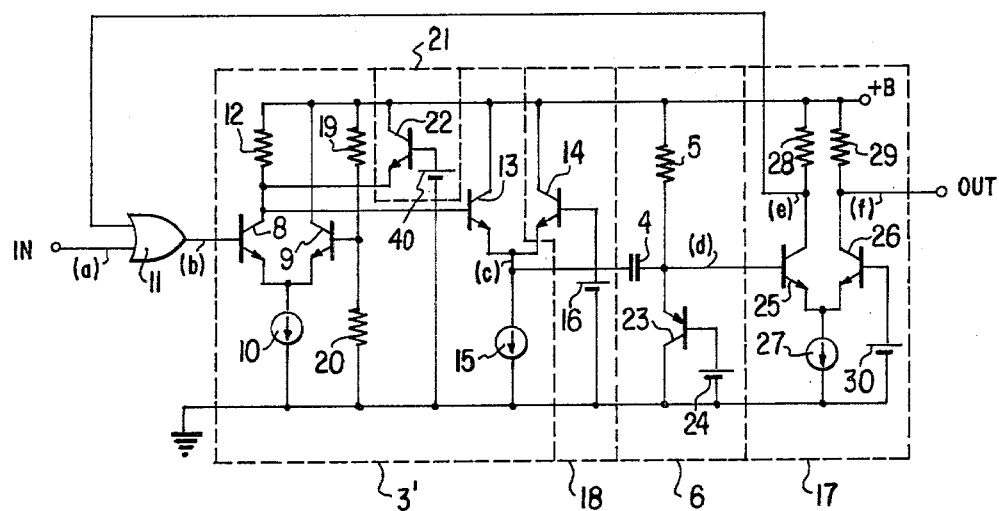
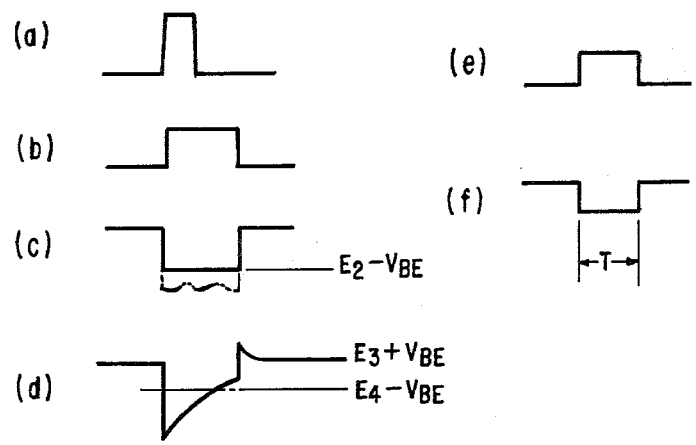
FIG. 6

FIG. 7
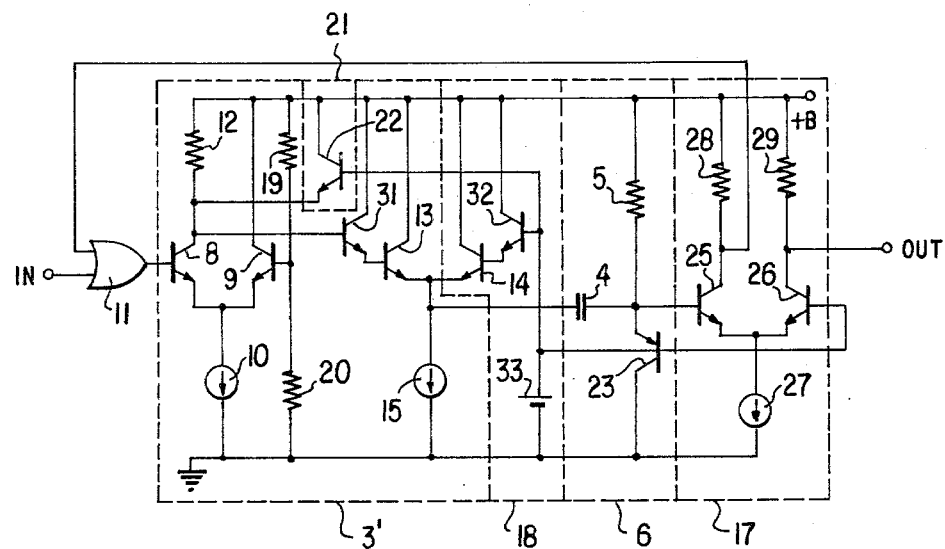
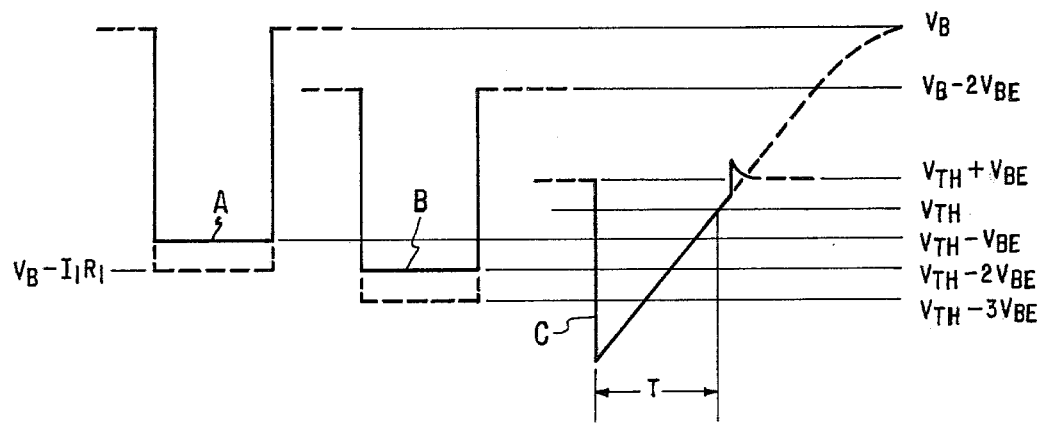
FIG. 8

MONOSTABLE MULTIVIBRATOR

RELATED APPLICATIONS

This application is related to U.S. application Ser. No. 859,539, filed Dec. 12, 1977 (now U.S. Pat. No. 4,182,963 granted Jan. 8, 1980) and two other U.S. Applications filed by the same applicants on the same date (Dec. 8, 1978) as the present application, the two other applications (U.S. Ser. Nos. 967,640 and 967,639) being respectively entitled "Improved Trigger Pulse Forming Circuit" and "Improved Monostable Multivibrator".

BACKGROUND OF THE INVENTION

This invention relates to an improvement in monostable multivibrators.

A conventional monostable multivibrator is constructed, for example, as shown in FIG. 1, by cascade-connecting a gate circuit (for example, an OR circuit) 1, a driver circuit 3 comprising a saturating transistor switch circuit including a transistor 2, a differentiating circuit 6 consisting of a capacitor 4 and a resistor 5 and a voltage comparison circuit (for example, an inverter) 7 where the output of voltage comparison circuit 7 is fed back to one input of gate circuit 1. The input signal is supplied to the other input of gate circuit 1 and a pulse output synchronized with the input signal is obtained from the output terminal of voltage comparison circuit 7.

When this circuit is converted to an integrated circuit, because driver circuit 3 is a saturating transistor switch circuit, high frequency, AC current flows to the substrate of the integrated circuit causing anomalous phenomena and unstable operation of the monostable multivibrator. In order to avoid this anomalous phenomena, it is necessary to make all circuits a non-saturating type, where a non-saturating transistor switch circuit would be used in the driver circuit of the differentiating circuit. The non-saturating transistor switch circuit may, for example, comprise an emitter-coupled differential amplifier such as shown in FIG. 2, in which the emitters of transistors 8 and 9 are connected in common. The common connection point is grounded through a constant current source 10, and the collector of transistor 8 is connected through a load resistor 12 to power supply +B where the collector of transistor 9 is directly connected to the power supply. In addition, although the output of the driver circuit is shown as connected to the collector of transistor 8, it may also be taken from transistor 9.

When the above-mentioned differential amplifier shown in FIG. 2 is used as a driver circuit 3' instead of the driver circuit 3 shown in FIG. 1, the reference level (In this specification, the low level side of a positive pulse and the high level side of a negative pulse are denoted as reference levels) of the output of the driver circuit 3' is dependent upon the voltage $V_B$ of the power supply +B causing no problem. However, the peak level (In this specification, the high level side of the positive pulse and the low level side of the negative pulse are denoted as peak levels) is dependent upon the current of constant current source 10 and fluctuates according to the noise current of constant current source 10. Therefore, a shortcoming exists in that the peak level of the output of driver circuit 3' fluctuates and a change in the amplitude of the driving pulse that drives differentiating circuit 6 appears as a fluctuation in the output pulse width of the monostable multivibrator.

Thus, for example, when the monostable multivibrator using the driver circuit 3' shown in FIG. 2 is used in a pulse count wave detector of an FM receiver, there is a shortcoming in that a change in the output pulse width appears as a change in the DC voltage of the wave detector output and deteriorates the SN ratio of the wave detector output.

SUMMARY OF THE INVENTION

This invention was made in view of the above problems, and a primary object is to provide an improved monostable multivibrator not having the above shortcomings.

Other objects and advantages of this invention will be apparent from a reading of the following specification and claims taken with the drawing.

BRIEF DESCRIPTION OF THE DRAWING

FIG. 1 is a block diagram of a conventional monostable multivibrator.

FIG. 2 is a circuit diagram of an embodiment of a conventional driver circuit which consists of a non-saturating transistor switch circuit.

FIG. 3 is a circuit diagram of an illustrative monostable multivibrator in accordance with this invention.

FIG. 5 is a circuit diagram of a further illustrative embodiment of a monostable multivibrator in accordance with this invention.

FIGS. 6(a)–(f) are diagrams which illustrate the operation of the monostable multivibrator of FIG. 5.

FIG. 7 is a circuit diagram of a further illustrative embodiment of a monostable multivibrator in accordance with this invention.

FIG. 8 is a diagram which illustrates the operation of the monostable multivibrator of FIG. 7.

DETAILED DESCRIPTION OF PREFERRED EMBODIMENTS

Figure 4:
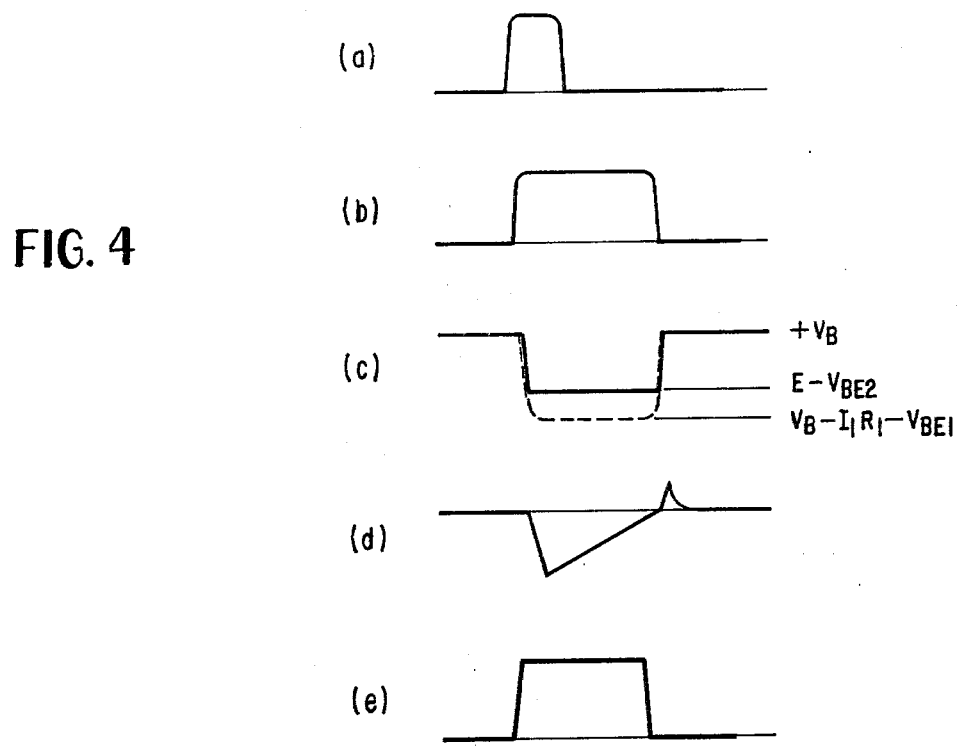
FIGS. 4(a), (b), (c), (d) and (e) are diagrams which illustrate the operation of the monostable multivibrator of FIG. 3.

Reference should be made to the drawing where like reference numerals refer to like parts.

In FIG. 3, 11 is a gate circuit having an OR function. The driver circuit 3' comprises an emitter-coupled differential amplifier in which the emitters of transistors 8 and 9 are connected in common and this common connection point is grounded through a constant current source 10. The collector of transistor 8 is connected, through a load resistor 12 to the power supply +B where the collector of transistor 9 is connected directly to the power supply. An emitter-follower circuit includes a transistor 13, whose base is connected to the collector of transistor 8 and a constant current source 15. The base of transistor 8 is connected to the output terminal of gate circuit 11 and the power supply +B is divided by resistors 19 and 20 in a series circuit such that the voltage across resistor 20 will be applied to the base of transistor 9. The emitter-follower circuit increases the driving capacity of driver circuit 3' by lowering the output impedance thereof.

A clipping circuit 18 comprises a transistor 14, whose emitter is connected in common with the emitter of transistor 13 of the emitter-follower circuit, and a bias power supply 16. The emitter-follower circuit and clipping circuit 18 may be effectively constructed as a differential amplifier. Also, bias power supply 16 may be supplied from the power supply +B by dividing it.

A differentiating circuit 6 comprises a capacitor 4 and a resistor 5. The differentiating circuit 6 feeds its output to a voltage comparison circuit 17 where the output of the voltage comparison circuit 17 is fed to one input terminal of gate circuit 11. Gate circuit 11, driver circuit 3', clipping circuit 18, and voltage comparison circuit 17 are implemented as non-saturating circuits.

In the circuit of FIG. 3, when the input signal shown in FIG. 4(a) is applied to gate circuit 11 from the input IN, the driver circuit 3' is responsive to the output of the gate circuit shown in FIG. 4(b) and invert-amplifies it with the emitter-coupled differential amplifier including transistors 8 and 9 and outputs it to the emitter-follower circuit.

The output waveform of driver circuit 3' has the shape shown by the broken line in FIG. 4(c) whose low level is $V_B - I_1 R_1 - V_{BE1}$ where $V_B$ is the voltage of power supply +B, $I_1$ is the current of constant current source 10, $R_1$ is the resistance of load resistor 12 and $V_{BE1}$ is the forward voltage drop between the base and emitter of transistor 13.

The clipping circuit 18 receives the output of driver circuit 3' shown by the broken line in FIG. 4(c) and its low level is clipped by transistor 14 at a voltage E established by bias power supply 16. Thus, a waveform having a low level of $(E - V_{BE2})$ as shown in FIG. 4(c) by the solid line occurs where $V_{BE2}$ is the voltage drop between the base and emitter of transistor 14. Consequently, the low level driving signal of differentiating circuit 6 is a constant voltage $(E - V_{BE2})$. The waveform shown in FIG. 4(c) by a solid line is differentiated by differentiating circuit 6, the output of the differentiating circuit 6 shown in FIG. 4(d) being inputted to voltage comparison circuit 17 where the output pulse shown in FIG. 4(e) is obtained at the output terminal OUT.

The driver circuit 3' shown in FIG. 3 employs NPN transistors. When PNP transistors are used, the high level of the output waveform changes. Therefore, the high level is clipped by employing a PNP transistor in clipping circuit 18.

As stated above, the circuits that comprise the monostable multivibrator of FIG. 3 are of a non-saturating type and each transistor is operated in an unsaturated state. Thus, they can be readily incorporated into an integrated circuit. And, when they are incorporated into an integrated circuit, virtually no AC current flows to the substrate, power supply line, or ground line, of the integrated circuit, and the occurrence of anomalous phenomena due to AC current can be prevented. In addition, by clipping the level of the driving signal that drives the differentiating circuit on the side that fluctuates due to noise, fluctuation of the output pulse width of the monostable multivibrator caused by the noise is eliminated. Thus, when the monostable multivibrator of this invention is used, for example, as a pulse counting wave detector that demodulates FM signals, the S/N ratio can be improved.

In FIG. 5, gate circuit 11, driver circuit 3', clipping circuit 18, differentiating circuit 6 and voltage comparison circuit 17 are cascade-connected where an anti-saturation circuit 21 is connected to driver circuit 3' and the output of voltage comparison circuit 17 is fed back as one input to gate circuit 11. The anti-saturation circuit 21 comprises a transistor 22 whose collector and emitter are connected to the two ends of load resistor 12 and a bias power supply 40 supplies the base bias voltage to the base of transistor 22.

To differentiating circuit 6 is added a clamping circuit comprising a transistor 23, whose emitter and collector are connected between the differential output terminal and ground and a power supply 24 that supplies the base bias voltage to the base of the transistor 23.

Voltage comparison circuit 17 includes a transistor 25, the base of which is connected to the output of differentiating circuit 6 and the emitter of which is connected to the emitter of a transistor 26, the common emitter connection being grounded through a constant current source 27. The collectors of transistors 25 and 26 are separately connected to the power supply +B through load resistors 28 and 29 respectively and the voltage of a threshold power supply 30 is applied to the base of transistor 26. The collector output of transistor 25 is fed back to the one input terminal of gate circuit 11 and the output of the monostable multivibrator is obtained from the collector output of transistor 26.

When the external pulse shown in FIG. 6(a) is applied to the input terminal IN, the output signal of gate circuit 11 shown in FIG. 4(b) is applied to driver circuit 3' and it is shaped, inverted, impedance-converted and outputted by driver circuit 3'. Fluctuation in the output pulse width of the monostable multivibrator caused by noise can be suppressed by improving the input carrier and noise ratio of voltage comparison circuit 17. Therefore, a larger amplitude in the driving pulse for differentiating circuit is more desirable. However, when the differential amplifier shown in FIG. 2 is used as a driver circuit for the differentiating circuit and the output thereof is amplified, transistor 8 is readily saturated because of irregularities and drifts in the voltage $V_B$ of power supply +B, the current $I_1$ of constant current source 10 and the resistance $R_1$ of load resistor 12. For this reason, anti-saturation circuit 21 is employed so that transistor 8 will not saturate. In order to prevent transistor 8 from saturating when the collector voltage of transistor 8, in its ON state, drops below the high level of the gate circuit 11 output, the voltage $E_1$ of the base bias power supply 40 is selected at $V_S + V_{BE} < E_1$ where $V_S$ is the high level of the gate circuit 11 output and $V_{BE}$ is the forward threshold value between the base and emitter of transistor 22. Hence, the output of driver circuit 3' is the voltage $V_B$ of power supply +B at the reference level and the voltage $(V_B - I_1 R_1)$ at the peak level. However, the peak level is clipped with the voltage $(E_1 - V_{BE})$ when the relationship $(V_B - I_1 R_1) < (E_1 - V_{BE})$ is satisfied. And, since the voltage $E_1$ of the base bias power supply 40 is set at $E_1 > V_S + V_{BE}$, transistor 8 does not become saturated even by irregularities and drifts in the voltage $V_B$, current $I_1$ or resistance $R_1$. When the output of the driver circuit 3' is clipped by anti-saturation circuit 21, the effect of the previously mentioned noise current of constant current source 10 is also prevented.

Further, the peak level of the output of driver circuit 3' is clipped by transistor 14 of clipping circuit 18 as shown in FIG. 6(c) with a solid line at the voltage ($E_2-V_{BE}$) where the voltage of the base bias power supply 16 is $E_2$. Thus, even when the output of driver circuit 3' is not clipped by anti-saturation circuit 21, the fluctuation in the output of the driver circuit 3' shown in FIG. 6(c) with a broken line, caused by the fluctuation of the noise current of constant current source 10, is always removed by the action of clipping circuit 18 as described hereinbefore with respect to FIGS. 3 and 4. Hence, the fluctuation in the output pulse width of the monostable multivibrator caused by fluctuation in the noise current of current source 10 is also eliminated.

The output of clipping circuit 18 shown in FIG. 6(c) by a solid line is differentiated by differentiating circuit 6 comprising capacitor 4 and resistor 5 and the differentiated output is clamped by transistor 23 at ($E_3+V_{BE}$) resulting in the waveform shown in FIG. 6(d) where $E_3$ is the voltage of the base bias power supply 24. At voltage comparison circuit 17, a threshold voltage is supplied by power supply 30 and a stable waveform output shown in FIG. 6(e) is obtained at the collector output of transistor 25 and a stable waveform output shown in FIG. 6(f) at the collector output of transistor 26.

However, when the base bias power supply 40 of the above-mentioned anti-saturation circuit 21, base bias power supply 16 of clipping circuit 18, base bias power supply 24 of clamping circuit and the threshold power supply 30 of voltage comparison circuit 17 are supplied separately, anomalous phenomena sometimes occur due to the irregularities in elements composing the various circuits which can result in a shortcoming in that the applicable voltage range is narrowed. To eliminate the above-mentioned problem, the monostable multivibrator shown in FIG. 7 has a common power supply 33 for the various base bias power supplies 40, 16 and 24 and the threshold power supply 30 shown in FIG. 5 where the voltage $V_{TH}$ of the common constant voltage source 33 is applied to each of the bases of transistor 22 of the anti-saturation circuit 21, transistor 14 of clipping circuit 18, transistor 23 of differentiating circuit 6 and transistor 25 of voltage comparison circuit 17. In addition, transistor 13 of the emitter-follower circuit of driver circuit 3' and transistor 14 of clipping circuit 18 are separately connected to transistors 31 and 32 respectively by Darlington connections.

When a positive pulse is applied to the input terminal IN of the monostable multivibrator shown in FIG. 7, the output of gate circuit 11 is shaped and inverted by the differential amplifier of driver circuit 3' comprising transistors 8 and 9 and a pulse with a reference level of voltage $V_B$ and a peak level of ($V_B-I_1R_1$) is obtained at the collector of transistor 8 where $I_1$ and $R_1$ are current of constant current source 10 and the resistance of load resistor 12, as in the case shown in FIG. 5. Saturation of transistor 8 is prevented by transistor 22 as stated previously. In this case, the voltage of constant voltage source 33, $V_{TH}$, is selected as $V_{TH}>V_S+V_{BE}$. If the peak level of the output of driver circuit 3' satisfies the relationship of ($V_B-I_1R_1$)<($V_{TH}-V_{BE}$), it is clipped at ($V_{TH}-V_{BE}$) by the transistor 22. Thus, the output of driver circuit 3' results in the waveform shown in FIG. 8 at A. This output of driver circuit 3' is applied to clipping circuit 18 where the output impedance of driver circuit 3' is converted to a low impedance by transistors 13 and 31 thereby improving the driving capacity of the differentiating circuit 15 by the driver circuit 3'. At the same time, the voltage is shifted in level by 2 $V_{BE}$ resulting in the waveform ($V_B-2V_{BE}$) at the reference level and ($V_{TH}-3V_{BE}$) at the peak level. However, the peak level is clipped at ($V_{TH}-2V_{BE}$) by the transistors 14 and 32 and the output of clipping circuit 18, thus resulting in the waveform shown in FIG. 8 at B with a reference level of ($V_B-2V_{BE}$) and a peak level of ($V_{TH}-2V_{BE}$). The output of clipping circuit 18 is differentiated by capacitor 4 and resistor 5 where the output reference level of differentiating circuit 6 is clamped at ($V_{TH}+V_{BE}$) by transistor 23 and where the voltage $V_B$ of the power supply $+B$ connected to one terminal of resistor 5 is an asymptote and an output having the waveform shown in FIG. 8 at C is generated. This output of differentiating circuit 6 is applied to the NOT circuit 17 where the voltage $V_{TH}$, which is lower by $V_{BE}$ from the output reference level ($V_{TH}+V_{BE}$) of differentiating circuit 6, becomes the threshold and a square wave pulse with a pulse width of T is obtained at the collectors of transistors 25 and 26. In this case, the collector output of transistor 25 is a positive pulse and the collector output of transistor 26 is a negative pulse.

The output pulse width of the monostable multivibrator shown in FIG. 7 will be discussed. Assuming (a) the driving pulse amplitude for the differentiating circuit is (B'$-$e') and (b) the output pulse amplitude of the differentiating circuit, at the time the driving pulse amplitude for the differentiating circuit is 1, equals k, the output pulse amplitude of the differentiating circuit is k(B'$-$e'). Therefore, the pulse width T of the output pulse of the monostable multivibrator can be expressed as $$T = -CR \log_e \frac{B-V_{TH}}{B-e+k(B'-e')}$$

when each bias voltage is mutually unrelated where C is the electrostatic capacity of the differentiating capacitor, R is the resistance of the differentiating resistor, B is the voltage of the output asymptote of the differentiating circuit, e is the reference level of the output of the differentiating circuit, B' is the reference level of the output pulse of driver circuit 3' and e' is the peak level of the output pulse of driver circuit 3'. Thus, with respect to the monostable multivibrator of FIG. 7,
$B=V_B$, $e=V_{TH}+V_{BE}$, $B'=V_B-2V_{BE}$, and $e'=V_{TH}-2V_{Be}$.
And, $$T = -CR \log_e \frac{1}{(1+k)\frac{V_{BE}}{V_B-V_{TH}}}$$

results.

Then, if $V_{BE}/(V_B-V_{TH})$ is so selected that $(1+k)>>(V_{BE}/V_B-V_{TH})$, virtually no change occurs in the output pulse width T with respect to irregularities and drifts in the voltage $V_B$ at the power supply $+B$, the base bias voltage (threshold voltage) $V_{TH}$ and $V_{BE}$ of the transistors.

As stated above, when this invention is used, a linear integrated circuit can be readily obtained because the gate circuit, the driver circuit, and the voltage comparison circuit that comprise the monostable multivibrator are made non-saturating circuits. Thus, it can prevent anomalous phenomena caused by the flowing of high frequency current to the substrate of the integrated circuit which occurs when saturating circuits are used.

Furthermore, since the circuitry of FIG. 7 is such that the various base bias voltages and the threshold voltages of the anti-saturation circuit of the driver circuit output, clipping circuit, clamping circuit of the differentiated output and the voltage comparison circuit are supplied from one common constant voltage source, the circuitry is simplified. Further, since the operating voltage of various parts of the anti-saturation circuit, clipping circuit, clamping circuit of the differentiated output, and the NOT circuit are related, anomalous operations due to fluctuations in various conditions is eliminated. Also, changes in the output pulse width with respect to irregularities and drifts in the respective constant voltage source, constant current source, and circuit element values can be reduced.

In addition, various bias voltages and threshold voltages are made common and supplied from the common constant voltage source. Thus, compared with the case where the voltage sources are independently provided, the number of capacitors required for the power supply for the elimination of high frequency components is reduced and the number of external terminals required for capacitors for the elimination of high frequency components can be reduced in converting to an integrated circuit.

Figure 9:
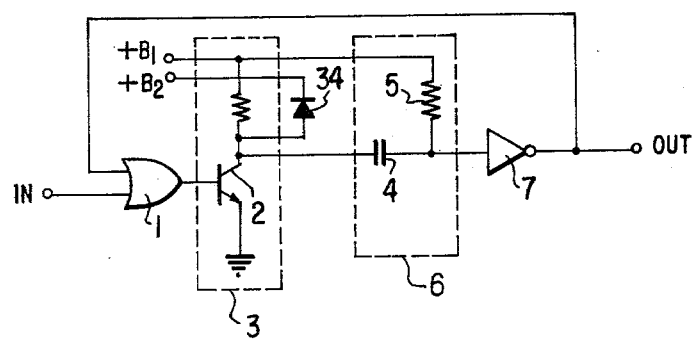
FIG. 9 is a block diagram of a conventional monostable multivibrator which is a modification of the FIG. 1 multivibrator.

Another aspect of the circuit of FIG. 1 is that the rise in the output of driver circuit 3 is slower than the rise in the external input pulse impressed on input terminal IN of gate circuit 1. Therefore, as shown in FIG. 9, the collector of transistor 2 is connected to a clipping power supply $+B_2$ through a diode 34 so that the reference level of its output is clipped at the voltage $VB_2$ of clipping power supply $+B_2$ so as to speed up the rise time of the output of driver circuit 3. However, although the output rise time of driver circuit 3 is shortened, there still is a shortcoming in that the output pulse width of the monostable multivibrator changes greatly when the voltage $VB_1$ of the power supply $+B_1$ fluctuates where the power supply $+B_1$ corresponds to power supply $+B$ of FIG. 1.

Figure 10:
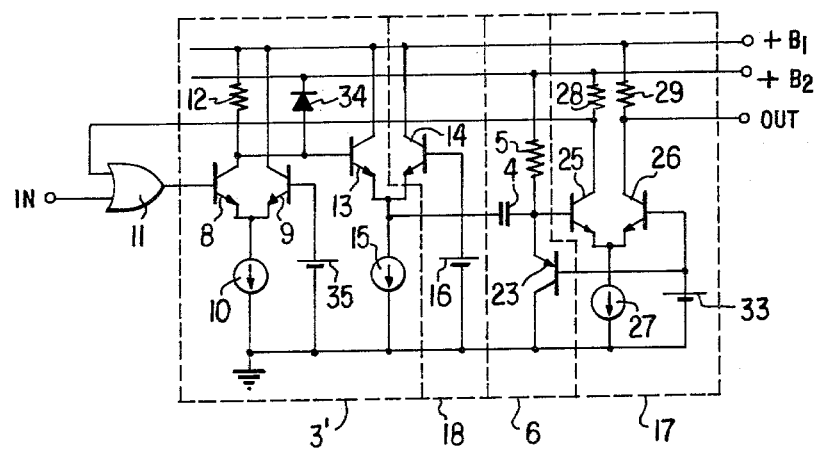
FIG. 10 is a circuit diagram of a further illustrative embodiment of a monostable multivibrator in accordance with this invention.

In FIG. 10 driver circuit 3' comprises differential amplifier including transistor 8 fed by the output of gate circuit 11, transistor 9 connected to the voltage of threshold power supply 35, constant current source 10 and load resistor 12 for transistor 8. The emitter-follower circuit comprising transistor 13 is fed by the collector output of transistor 8 and constant current source 15. The anode of diode 34 is connected to the collector of transistor 8 and the cathode is connected to clipping power supply $+B_2$.

Figure 11:
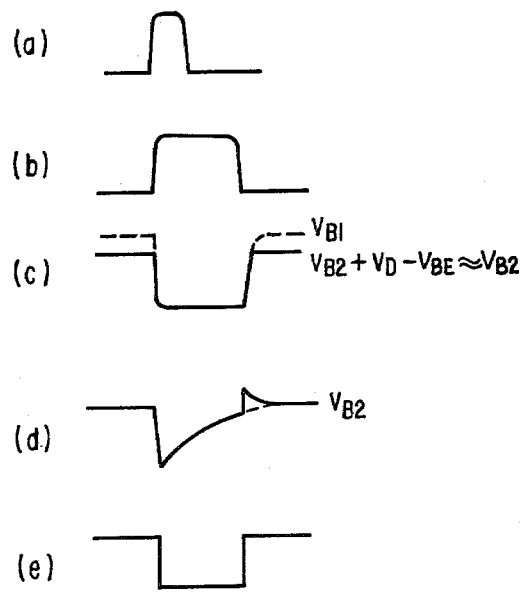
FIGS. 11(a)–(e) are diagrams which illustrate the operation of the monostable multivibrator of FIG. 10.

The operation of the monostable multivibrator of FIG. 10 will now be explained. When the input pulse shown in FIG. 11(a) is impressed on the input terminal IN of gate circuit 11, the input pulse shown in FIG. 11(b) is applied to the input of driver circuit 31. Then, the input pulse of FIG. 11(b) is inverted and shaped by driver circuit 31, the reference level of the output being clipped at the voltage $(V_{B2}+V_D-V_{BE} \approx V_{B2})$ by diode 34 as shown in FIG. 11(c) by a solid line where $V_{B2}$ is the voltage of power supply $+B_2$ and $V_D$ is the voltage drop of diode 34 in the ON state. This output of driver circuit 3' shown in FIG. 11(c) by the solid line is differentiated by differentiating circuit 6 resulting in the waveform shown in FIG. 11(d). In this case, the asymptotic characteristic of the differentiated output waveform is determined by the voltage $V_{B2}$ of clipping power supply $+B_2$ where the asymptote of the differentiated output waveform is $V_{B2}$. The output of differentiating circuit 6 is fed to voltage comparison circuit 17 and the output shown in FIG. 11(e) is produced as the output of the monostable multivibrator.

In the circuit shown in FIG. 10, when the voltage $V_{B1}$ of power supply $+B_1$ fluctuates, virtually no change appears in the output waveform of the differentiating circuit 6 because one terminal of differentiating resistor 5 is connected to clipping power supply $+B_2$. Thus, the output pulse width of the monostable multivibrator does not fluctuate as a result of fluctuations in the voltage $V_{B1}$ of power supply $+B_1$. The degree of influence of fluctuations in the voltages $V_{B1}$ and $V_{B2}$ of power supply $+B_1$ and clipping power supply $+B_2$ can be obtained by calculation for cases in which differentiating resistor 5 is connected to power supply $+B_1$ and when it is connected to clipping power supply $+B_2$.

(1) When differentiating resistor 5 is connected to power supply $+B_1$:

$$T = -C_T R_T \log_e \left( \frac{V_{B1} - E_1}{V_{B1} - E_1 - V_{BE} + K\{V_{B2} + V_D - V_{BE} - (E_2 - V_{BE})\}} \right) \quad (1)$$

K is the amplitude of the differentiated pulse from differentiating circuit 6 when the output pulse amplitude of driver circuit 3' is 1 (K < 1); $C_T$ is the capacitance of capacitor 4; $R_T$ is the resistance of resistor 5; $V_{BE}$ is the forward voltage between the base and the emitter of transistor 23; $E_1$ is the voltage of power supply 33; $E_2$ is the voltage of bias power supply 16; $V_D$ is the forward drop voltage of diode 34 and T is the width of the output from the monostable multivibrator.

However, since $V_{BE} \approx V_D$, the above equation (1) is rewritten as $$T = -C_T R_T \log_e \left( \frac{V_{B1} - E_1}{V_{B1} - E_1 + KV_{B2} + (K-1)V_{BE} - KE_2} \right) \quad (2)$$

Then, when T in Equation (2) is differentiated with $V_{B1}$ as a function of the voltage $V_{B1}$, $$T(V_{B1}) = \frac{dT(V_{B1})}{dV_{B1}} = \quad (3)$$

$$-C_T R_T \left( \frac{V_{B1} - E_1 + KV_{B2} + (K-1)V_{BE} - KE_2}{V_{B1} - E_1} \right) \times$$

$$\frac{V_{B1} - E_1 + KV_{B2} + (K-1)V_{BE} - KE_2 - (V_{B1} - E_1)}{\{V_{B1} - E_1 + KV_{B2} + (K-1)V_{BE} - KE_2\}^2} =$$

$$-C_T R_T \frac{KV_{B2} + (K-1)V_{BE} - KE_2}{(V_{B1} - E_1)\{V_{B1} - E_1 + KV_{B2} + (K-1)V_{BE} - KE_2\}}$$

In order for the monostable multivibrator to operate, $V_{B2}$ $$> \left\{ E_2 + \left( \frac{1-K}{K} \right) \right\} V_{BE}$$

becomes a necessary condition. Thus, $$\therefore T'(V_{B1}) > 0 \quad (4)$$

Next, when T of Equation 2 is differentiated by $V_{B2}$ as a function of the voltage $V_{B2}$, $$T'(V_{B2}) = \frac{dT_1(V_{B2})}{dV_{B2}} = \quad (5)$$

$$-C_T R_T \left( \frac{V_{B1} - E_1 + KV_{B2} + (K-1)V_{BE} - KE_2}{V_{B1} - E_1} \right) \times$$

$$\left( \frac{-K(V_{B1} - E_1)}{\{V_{B1} - E_1 + KV_{B2} + (K-1)V_{BE} - KE_2\}^2} \right) =$$

$$C_T R_T \frac{K(V_{B1} - E_1)}{(V_{B1} - E_1)\{V_{B1} - E_1 + KV_{B2} + (K-1)V_{BE} - KE_2\}}$$

In order for the monostable multivibrator to operate, $V_{B1} > E_1$ becomes a necessary condition. Thus, $$\therefore T'(V_{B2}) > 0 \quad (6)$$

When the above equations (4) and (6) are studies, they reveal that the output pulse width fluctuations of the monostable multivibrator cannot be eliminated with respect to the voltage fluctuations of either the voltage $V_{B1}$ or $V_{B2}$ of the power supplies $+B_1$ and $+B_2$ if the differentiating resistor 5 is connected to the power supply $+B_1$, and the output pulse amplitude of the driver circuit 3' is determined by $V_{B2}$ and $E_2$.

(2) When the differentiating resistor 5 is connected to clipping power supply $+B_2$ (as in FIG. 10)

$$T = -C_T R_T \log_e \left( \frac{V_{B2} - E_1}{V_{B2} - E_1 - V_{BE} + K\{V_{B2} + V_D - V_{BE} - (E_2 - V_{BE})\}} \right) \quad (7)$$

However, since $V_{Be} \cong V_D$, the above equation (7) may be rewritten as $$T = -C_T R_T \log_e \left( \frac{V_{B2} - E_1}{(1+K)V_{B2} - E_1 - KE_2 + (K-)V_{BE}} \right) \quad (8)$$

Then, Fluctuations in the voltage $V_{B1}$ of power supply $+B_1$ become unrelated to the output pulse width of the monostable multivibrator by connecting differentiating resistor 5 to clipping power supply $+B_2$. Thus, when T of the above equation (8) is differentiated with $V_{B2}$ as a function of the voltage $V_{B2}$, $$T'(V_{B2}) = \frac{dT(V_{B2})}{dV_{B2}} = \quad (9)$$

$$-C_T R_T \left( \frac{(1+K)V_{B2} - E_1 - KE_2 + (K-1)V_{BE}}{V_{B2} - E_1} \right) \times$$

$$\frac{(1+K)V_{B2} - E_1 - KE_2 + (K-1)V_{BE} - (1+K)(V_{B2} - E_1)}{\{(1+K)V_{B2} - E_1 - KE_2 + (K-1)V_{BE}\}^2} =$$

$$-C_T R_T \frac{KE_1 - KE_2 + (K-1)V_{BE}}{(V_{B2} - E_1)\{(1+K)V_{B2} - E_1 - KE_2 + (K-1)V_{BE}\}}$$

In the above equation (9), if the equation is set to satisfy $$T'(V_{BE}) = 0 \quad (10)$$

the fluctuation in the output pulse width of the monostable multivibrator is eliminated with respect to the fluctuation in the voltage $V_{BE}$ of the clipping power supply $+B_2$. Thus, from equations (9) and (10), $$KE_1 - KE_2 + (K-1)V_{BE} = 0 \quad (11)$$

$$E_1 = E_2 - \left( \frac{K-1}{K} \right) V_{BE} \quad (12)$$

results.

In other words, if the voltage $E_1$ of the power supply 25 and the voltage $E_2$ of the bias power supply 18 are set such that the above equation (12) is satisfied, the output pulse width of the monostable multivibrator can be kept constant irrespective of the fluctuations in the voltage $V_{B2}$ of the clipping power supply $+B_2$.

As explained above, when the invention of FIG. 10 is used, one terminal of the differentiating resistor is connected to the clipping power supply and the asymptote of the output waveform of the differentiating circuit becomes the voltage of the clipping power supply. Thus, the output waveform of the differentiating circuit becomes unrelated to the fluctuations in the power supply and fluctuations in the output pulse width of the monostable multivibrator are suppressed.

The above description has been given for a monostable multivibrator deriving a negative pulse output but the same applies to a monostable multivibrator deriving a positive pulse.

What is claimed is:

1. In a monostable multivibrator including a gate circuit having first and second inputs, a driver circuit responsive to the output of said gate circuit, a differentiating circuit responsive to the output of said driver circuit and a voltage comparison circuit responsive to the output of the said differentiating circuit where said gate circuit is adapted to have a trigger pulse applied to said first input thereof and the output of said voltage comparison circuit fed back to said second input thereof, the improvement in said monostable multivibrator where said driver circuit includes (a) at least one transistor of a differential transistor pair responsive to said output of the gate circuit for producing said output of the driver circuit, (b) a constant current source in circuit with said one transistor and (c) means for preventing saturation of said one transistor and where a clipping circuit clips the output of said driver circuit to lessen the effect of noise produced by said constant current source on the output of said multivibrator.

2. The improvement as in claim 1 where said clipping circuit includes means responsive to a bias voltage and said voltage comparison circuit includes means responsive to a threshold voltage, said improvement including a constant voltage source for providing said bias voltage and said threshold voltage in common and at substantially the same voltage.

3. The improvement as in claim 2 including clamping means for clamping said output of the differentiating circuit to a reference level, said clamping means including means responsive to a bias voltage, said bias voltage being provided by said constant voltage source.

4. The improvement as in claim 1 including (a) a bias voltage source for said driver circuit and said voltage comparison circuit, (b) a further voltage source and (c) clipping means connected from said further voltage source to the output of said driver circuit.

5. The improvement as in claim 4 where said further voltage source determines the asymptotic characteristic of the output from said differentiating circuit.

6. The improvement as in claim 5 where said differentiating means includes a capacitor and a resistor, the resistor being connected to said further voltage source.

7. The improvement as in claim 1 including an emitter follower circuit responsive to the output of the driver circuit, said clipping circuit clipping the output of the emitter follower.

8. The improvement as in claim 7 where said emitter follower circuit comprises a transistor whose emitter is connected to a constant current source and said clipping circuit comprises a transistor whose emitter is also connected to said last-mentioned constant current source so that the emitter follower circuit and the clipping circuit may be effectively fabricated as a differential amplifier.

9. The improvement as in claim 8 where said driver circuit comprises an emitter-coupled differential amplifier, said one transistor being one of the transistors of the differential amplifier and said current source being connected to the common emitters.

10. The improvement as in claim 1 where said clipping circuit clips the signal occurring at the output electrode of said one transistor to not only lessen the effect of the noise produced by said constant current source but also to prevent saturation of said one transistor if the amplitude of the input signal applied thereto is very large.

11. The improvement as in claim 10 including a bias voltage source for said driver circuit and said voltage comparison circuit, said clipping circuit connected from said bias voltage source to said output electrode of said one transistor.

12. The improvement as in claim 10 or 11 where said driver circuit comprises an emitter-coupled differential amplifier, said one transistor being one of the transistors of the differential amplifier, said current source being connected to the common emitters, and said clipping circuit being connected to the collector of said one transistor.

13. The improvement as in claim 12 where said driver circuit includes a load resistor connected to the collector of said one transistor and said clipping circuit comprises a transistor, the emitter of which is also connected to said collector.

14. The improvement as in claims 10 or 11 including an emitter follower circuit responsive to the output of the driver circuit and a further clipping circuit for clipping the output of the emitter follower.

15. The improvement as in claim 14 where said emitter follower circuit comprises a transistor whose emitter is connected to a constant current source and said further clipping circuit comprises a transistor whose emitter is also connected to said last-mentioned constant current source so that the emitter follower circuit and the further clipping circuit may be effectively fabricated as a differential amplifier.

16. The improvement as in claim 15 where said driver circuit comprises an emitter-coupled differential amplifier, said one transistor being one of the transistors of the differential amplifier and said current source being connected to the common emitters.

17. The improvement as in claim 1 including a clamping means for clamping said output of the differentiating circuit to a reference level, said clamping means including means responsive to a first bias voltage and where said clipping circuit includes means responsive to a second bias voltage and said voltage comparison circuit includes means responsive to a threshold voltage, said improvement including a constant voltage source for providing at least two of (a) said first bias voltage, (b) said second bias voltage and (c) said threshold voltage in common and at substantially the same voltage.

18. The improvement as in claim 17 where said constant voltage source includes means for providing said first bias voltage and said threshold voltage in common and at substantially the same voltage.

19. In a monostable multivibrator including a gate circuit having first and second inputs, a driver circuit responsive to the output of said gate circuit, a differentiating circuit responsive to the output of said driver circuit and a voltage comparison circuit responsive to the output of said differentiating circuit where said gate circuit is adapted to have a trigger pulse applied to said first input thereof and the output of said voltage comparison circuit fed back to said second input thereof, the improvement in said monostable multivibrator including at least one bias voltage source for said driver circuit and said voltage comparison circuit;
a further voltage source;
clipping means connected from said further voltage source to the output of said gate circuit and where said further voltage source determines the asymptotic characteristic of the output from said differentiating circuit.

20. The improvement as in claim 19 where said differentiating means includes a capacitor and a resistor, the resistor being connected to said further voltage source.

* * * * *